US 6,613,977 B1

(12) United States Patent
Fowler

(10) Patent No.: US 6,613,977 B1
(45) Date of Patent: Sep. 2, 2003

(54) APPARATUS AND METHODS TO CONTAIN RADIO FREQUENCY ENERGY WITHIN A HOUSING OF AN ELECTRONIC DEVICE

(75) Inventor: Duane Fowler, Boulder Creek, CA (US)

(73) Assignee: Apple Computer, Inc., Cupertino, CA (US)

( * ) Notice: Subject to any disclaimer, the term of this patent is extended or adjusted under 35 U.S.C. 154(b) by 0 days.

(21) Appl. No.: 09/775,861

(22) Filed: Feb. 1, 2001

(51) Int. Cl.[7] .............................................. H05K 9/00
(52) U.S. Cl. ................. 174/35 GC; 361/683; 361/685
(58) Field of Search ................ 174/35 R, 35 GC; 361/816, 818, 800, 683, 685

(56) References Cited

U.S. PATENT DOCUMENTS 4,308,417 A * 12/1981 Martin .................. 174/35 GC
4,785,136 A * 11/1988 Mollet et al. ............. 174/35 R

* cited by examiner

Primary Examiner—Hung V. Ngo
(74) Attorney, Agent, or Firm—Blakely, Sokoloff, Taylor & Zafman LLP

(57) ABSTRACT

An apparatus and methods to contain radio frequency energy within the housing of an electronic device are provided. The apparatus includes a flexible covering attached to the housing of the electronic device to cover an opening in the housing. The flexible covering is substantially impermeable to radio frequency energy and has a slot formed therein to allow objects to be inserted into and removed from the interior of the electronic device. In one embodiment, the flexible covering is an electrically conductive cloth. The cloth may be supported by a frame and attached to the housing, or be simply attached to the housing, using an electrically conductive adhesive. The edges of the slot are substantially coterminous along the length of the slot to trap radio frequency energy within the housing of the electronic device. A colored dust cover may be attached to the flexible material to provide a desired aesthetic appearance.

17 Claims, 3 Drawing Sheets

APPARATUS AND METHODS TO CONTAIN RADIO FREQUENCY ENERGY WITHIN A HOUSING OF AN ELECTRONIC DEVICE

FIELD OF THE INVENTION

The field of the invention relates to generally to electronic devices having openings in their housings through which radio frequency energy can escape. More particularly, the present invention relates to electronic devices having CD/DVD drives, extension cards, or other internal components that are insertable and removable by users.

BACKGROUND OF THE INVENTION

Radio Frequency (RF) energy emitted by electrical components can interfere with the operation of radios, computers, televisions, and other electrical equipment. Consequently, efforts are made to shield sources of RF energy and restrict stray RF energy to confined areas, such as within the housing of an electronic device. It is difficult however, to contain RF energy for two reasons. First, RF energy can pass unimpeded through non-electrically conductive materials such as nylon, felt, and plastic. Second, RF energy can escape through tiny, thin openings in shielding materials that are greater than $\frac{1}{20}^{th}$ of the RF energy's wavelength. With today's computer processors approaching the 1 GHz range and beyond, the size of the minimally allowable gaps in shielding shrinks to about 2–3 mm long.

Where most electrical devices are concerned, the problem is not in shielding the housing of the electrical device, but in shielding openings in the housing, particularly those openings through which objects such as CD's and DVD's are inserted and removed. In the past, openings in the housing were shielded in two ways. First, the openings were equipped with a dust cover, typically nylon or plastic bristles intertwined to form a mesh slot, to reduce the amount of dust or other contaminants entering the interior of the housing. Second, the loading bay doors were shielded with a material impermeable to RF, which formed an RF blocking seal when the doors were closed.

These efforts, however, proved unsatisfactory for several reasons. First, the dust covers were not made of materials impermeable to RF energy. Additionally, prior art dust covers often had sizable gaps along the length of the dust cover slot. Consequently, RF energy escaped from the housing each time the loading bay doors were opened to allow insertion or removal of a CD, DVD, or other device. Second, dust covers made of abrasive materials, such as nylon and plastic, could scratch the surfaces of CD's and DVD's, thereby impairing their playability over time. Clearly, a solution is needed that contains RF energy whenever the main RF seal (loading bay door) is broken.

Particularly, as the shortcomings of the prior art show, it is desirable to provide a non-abrasive means to shield the openings in the housings of electronic devices such that RF energy is contained within the housing whenever the main RF seal (loading bay door) is broken. It is particularly desirable that such means of blocking RF energy permit the insertion and removal of objects such as CD's and DVD's.

As shown in the accompanying Figures and as described below, the present invention provides such a solution.

SUMMARY OF THE INVENTION

An apparatus and methods to contain radio frequency energy within the housing of an electronic device are provided. The apparatus includes a flexible covering attached to the housing of the electronic device to cover an opening in the housing. The flexible covering is substantially impermeable to radio frequency energy and has a slot formed therein to allow objects to be inserted into and removed from the interior of the electronic device. In one embodiment, the flexible covering is an electrically conductive cloth. The cloth may be supported by a frame and attached to the housing, or be simply attached to the housing, using an electrically conductive adhesive. The edges of the slot are substantially coterminous along the length of the slot to trap radio frequency energy within the housing of the electronic device. A colored dust cover may be attached to the flexible material to provide a desired aesthetic appearance.

BRIEF DESCRIPTION OF THE DRAWINGS

The present invention is illustrated by way of example and not limitation in the figures of the accompanying drawings, in which.

DETAILED DESCRIPTION OF THE PREFERRED EMBODIMENT

An apparatus and methods for containing radio frequency energy within a housing of an electronic device are disclosed. In the following detailed description, numerous specific details are set forth in order to provide a thorough understanding of the present invention. However, it will be apparent to one of ordinary skill in the art that these specific details need not be used to practice the present invention. In other circumstances, well-known structures, materials, or processes have not been shown or described in detail in order not to unnecessarily obscure the present invention.

Figure 1:
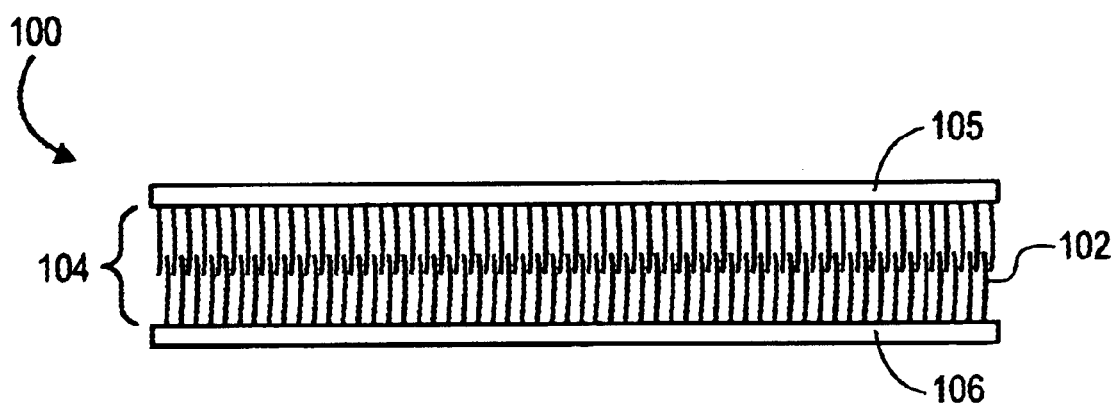
FIG. 1 illustrates a prior art dust cover.

Referring now to FIG. 1, an example of a prior art dust cover 100 is shown. Dust cover 100 is used to form a protective barrier over an opening the housing of an electronic device. Illustratively, such an opening may include a CD or DVD slot. Dust cover 100 is formed of two parts, an upper part 105, and a lower part 106. Each part is formed of a plurality of bristles 102, that when intertwined as shown in FIG. 1, form a protective mesh barrier over slot 104. Bristles 102 are made of nylon or plastic, and tend to be at least a little abrasive. Alternatively, dust cover 100 can be made of felt. In both embodiments, dust cover 100 can have any one of a wide range of decorative colors, such as for example, red, purple, blue, green, yellow, brown, black, etc. While dust cover 100 prevents dust and other contaminants from entering the interior of the housing of an electronic device, it is permeable to Radio Frequency (RF) energy. Consequently, RF energy will escape the housing whenever the opening's main RF seal (loading door) is broken.

Figure 2:
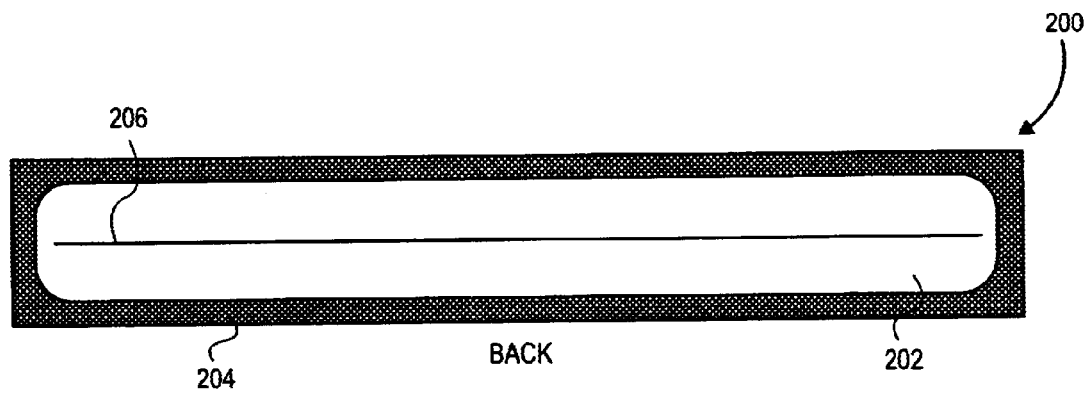
FIG. 2 illustrates a flexible covering supported by a frame according to an aspect of the present invention.

FIG. 2 illustrates a flexible covering 200 to contain RF energy within a housing of an electronic device such as a computer, stereo, CD player, DVD player, or similar electronic device. Flexible covering 200, in one embodiment, is formed of an electrically conductive cloth 202 in which a slot 206 is longitudinally disposed. Cloths having unprotected metal fibers or metal screens are not desirable for use with CD/DVD drives because such metallic components are abrasive and may scar or wear a CD or DVD as it is inserted or removed through slot 206, thereby reducing the CD's or DVD's playability. An example of a desirable cloth material is nylon fibers vacuum plated with metal. A cloth comprised of such fibers is impermeable to RF energy because the vacuum-plated metal makes it electrically conductive. Harmful abrasion to the CD or DVD is not a concern as such a cloth will probably wear out before the CD or DVD will. In short, the electrically conductive cloth has to be a "natural" cloth, not simply a plurality of metallic threads woven together.

Flexible covering 200 may be formed in one of two ways. First, a single piece of conductive cloth having a slot slit therein through the center may be used. Second, a plurality of pieces may be placed with their edges coterminous. In either embodiment, a frame 204 may be desirable to support the flexible covering 200, and may be particularly desirable in the second embodiment, where it is necessary to maintain the plurality of pieces at a certain tolerance. Without use of a frame 204, it is difficult to adhere the plurality of pieces of the flexible covering 200 to the housing of an electronic device such that an effective RF seal is created. When a frame 204 is not used, it may be necessary to position and adhere the plurality of pieces by hand, whereas use of a frame 204 may allow the flexible covering 200 to be robotically installed. In the embodiment shown in FIG. 2, frame 204 is applied to the back (interior) of flexible covering 200. Alternatively, frame 204 may be positioned at the front of flexible covering 200, so long as electrical contact is made between the conductive cloth 202 and the housing.

Frame 204 itself need not be electrically conductive, but if it is not, care should be taken to ensure that the flexible covering 200 touches or otherwise makes electrical contact with the housing of the electronic device. For example, if a plastic frame is used, the conductive cloth 202 should wrap around a non-conductive (plastic) frame so that the cloth 202 can make electrical contact with the housing. On the other hand, if a metallic frame 204 is used, it is sufficient that the flexible material touches the frame 204, which in turn, touches or otherwise makes electrical contact with the housing.

Regardless of the embodiment, flexible covering 200 must somehow make electrical contact with the housing. Otherwise, the flexible covering 200 would be "free floating." If flexible covering 200 were "free floating," the flexible covering 200 may absorb the stray RF energy and possibly reradiate that energy on the other side. To prevent the occurrence of such an unwanted transmission, flexible covering 200 must be grounded. Because the housings of most electrical devices are grounded, it suffices that flexible covering 200 touches or otherwise makes electrical contact with the housing. Of course, if a particular housing is not grounded, flexible covering 200 may be grounded using any one of a number of grounding means and methods well-known in the electrical arts.

An adhesive may be used to adhere flexible covering 202 to the frame 204, and/or to the housing of the electronic device. Such an adhesive should be electrically conductive to ensure that electrical contact is maintained between the flexible covering 202 and the housing. In one embodiment, such an adhesive may take the form of a conductive foam gasket surrounded on each side by the bare metal of the housing or frame 204 so that when the frame 204 or electrically conductive cloth 202 is compressed against the housing, the gasket compresses allowing electrical contact to be made with the bare metal. Electrically conductive adhesives are well known in the art, and adhesives suitable for use in embodiments of the present invention are commercially available from a number of nationally recognized suppliers.

Figure 3:
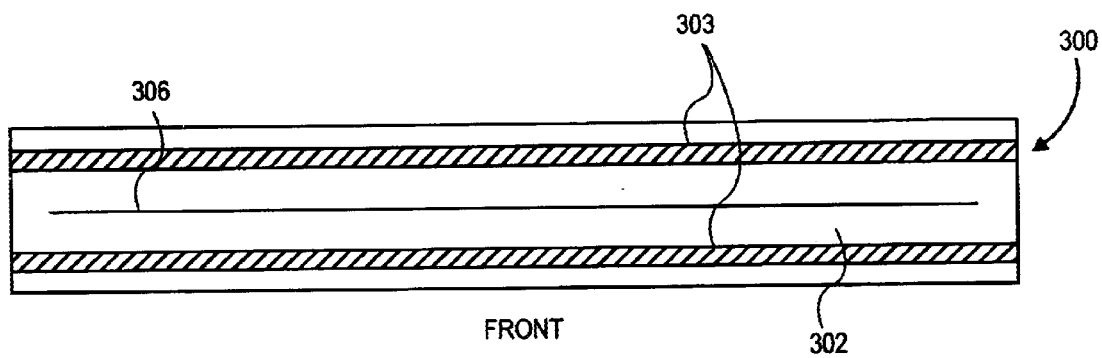
FIG. 3 illustrates a flexible covering supported by adhesive strips according to an aspect of the present invention.

In the embodiment shown in FIG. 3, the adhesive may take the form of adhesive strips 303 applied directly to electrically conductive cloth 302. In this manner, flexible covering 300 may be adhered directly to the housing of an electronic device. Adhesive strips 303 provide the minimal structural support needed to maintain the tolerances associated with slot 306. Adhesive strips 303 are illustratively shown running the length of conductive cloth 302, but may be positioned at any suitable location on the cloth 202 in any suitable configuration, such as for example, a row having a plurality of slanted adhesive strips separated by spaces.

Figure 4:
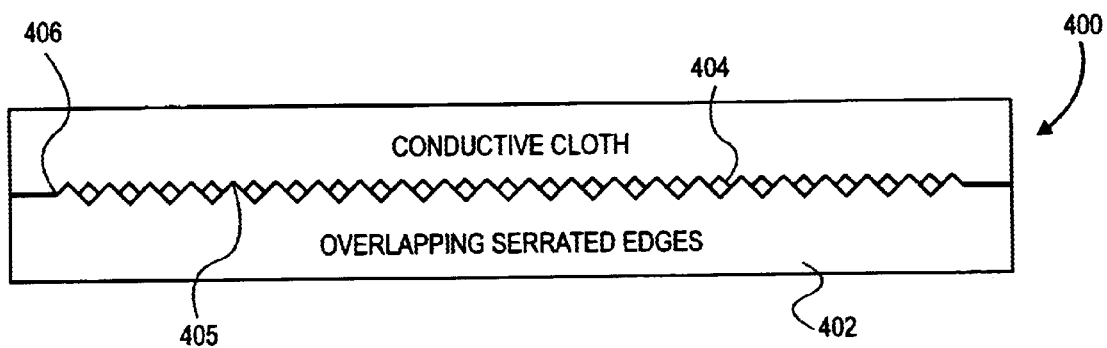
FIG. 4 illustrates a flexible covering which has a slot therein having overlapping serrated edges according to an aspect of the present invention.

FIG. 4 illustrates a flexible covering 400 and highlights one of the methods of ensuring that the slot 406 is impermeable to RF energy. One of the things that makes containment of RF energy problematic is that RF energy can escape through very thin, long, openings in otherwise RF impermeable material. As the frequency of RF energy increases, its wavelength shortens. Thus, the shorter the wavelength, the smaller the minimal allowable gap has to be to contain it. Illustratively, the length of the minimally allowable gap needed to contain stray RF energy generated by today's 1 Ghz and faster computer processors is approximately 2–3 mm. While it is important that the flexible covering 400 be made of an electrically conductive material 402, it is equally important that the edges of slot 406 substantially touch along the entire length of the flexible covering 400. If the edges of slot 406 are misaligned, or become worn with use, gaps may appear along slot 406 that are large enough to allow RF energy to escape. In the embodiments, previously shown, the edges of slot 406 are blunted. In the embodiment shown in FIG. 4, slot 406 may be formed of two pieces of conductive material having overlapping serrated edges (404, 405). The two pieces of conductive material need not touch 100% along the length of slot 406, but must touch in enough spots necessary to contain the stray RF energy. If the overlapping serrated edges embodiment is used, care should be taken to ensure that the amount of overlap does not adversely affect the insertion and removal of CD's and DVD's.

Figure 5:
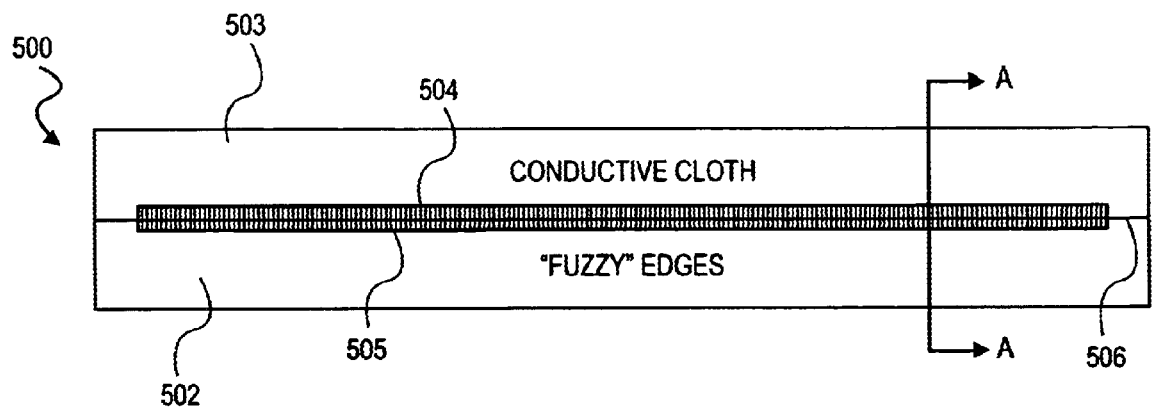
FIG. 5 illustrates a flexible covering which has a slot therein having overlapping fuzzy edges according to an aspect of the present invention.

In the embodiment shown in FIG. 5, flexible covering 500 may be formed of two pieces (502, 503) of conductive material having coterminous "fuzzy" edges (504, 505). Alternatively, the edges of a slot cut in a single piece of conductive material may be "fuzzied." "Fuzzying" the edges increases the surface area at slot 506, thereby ensuring significant retention of RF energy. In short, the fuzzy edges increase the number of contact points along slot 506, thereby significantly reducing the size of any gaps that might occur through which RF energy might escape. Line A—A in FIG.

5 is used to show the direction of side views shown in the remaining Figures and discussed below.

Figure 6A:
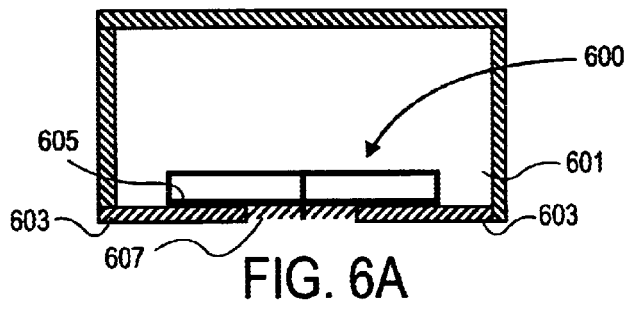
FIG. 6a is a side view of the flexible covering of FIG. 5 taken along line A—A, showing how the flexible covering may be mounted inside the housing of an electronic device.

FIG. 6a illustrates how a flexible covering 600 may be attached to the interior 601 of housing 603. FIG. 6a is a side view of the flexible covering 500 shown in FIG. 5 taken along the line A—A. In this embodiment, the front (exterior-most) side of flexible covering 600 is electrically coupled with an electrically conductive material 605. Such a material may be a metallic frame, or an electrically conductive strip of adhesive, as previously described. The material 605, in turn, is electrically coupled with the interior of housing 603. A dust cover 607 of the kind previously described is attached to (placed adjacent to) the front of the flexible covering 600 and may be colored to achieve a desired aesthetic appearance. Though not shown, the edges of flexible covering 600 may extend past or wrap around electrically conductive material 605.

Figure 6B:
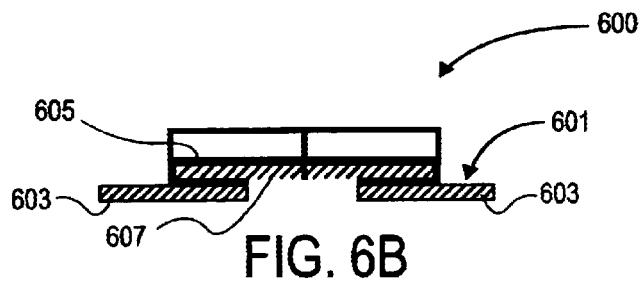
FIG. 6b is another side view of the flexible covering of FIG. 5 taken along line A—A, showing an alternative method of mounting the flexible covering inside the housing of an electronic device.

FIG. 6b is similar to FIG. 6a, except that the dust cover 607 has been incorporated within electrically conductive material 605, the ends of which wrap around the edges of dust cover 607. As in FIG. 6a, flexible covering 600 electrically contacts electrically conductive material 605. If material 605 is not electrically conductive, flexible covering 600 may wrap around material 605 to make electrical contact with the interior side 601 of housing 603.

Figure 7:
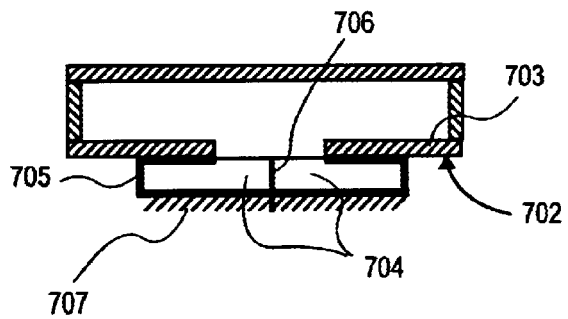
FIG. 7 is side view of the flexible covering of FIG. 5 taken along line A—A, showing how the flexible covering may be mounted outside the housing of an electronic device according to an aspect of the present invention.

FIG. 7 illustrates how a flexible covering 704 may be mounted on the exterior side 702 of housing 703 according to another embodiment of the present invention. In this embodiment, flexible covering 704 is enclosed within an electrically conductive material 705, which wraps around the sides of flexible covering 704. The rear (innermost) portion of conductive material 705 makes electrical contact with exterior side 702 of housing 703. Dust cover 707 is shown attached to the front (exterior-most) side of conductive material 705.

In one embodiment, the EMC CD/DVD slot shield is a conductive cloth that fits behind or is attached to the felt dust cover of a slot loaded CD/DVD drive. Radio Frequency (RF) energy is used by computers and computer peripherals to operate. Most computers use either metallic or metallized plastic enclosures to contain the stray RF energy so that it will not cause interference with radios, televisions, or other electronic equipment. Any openings in the enclosure will allow the RF energy to escape and usually the CD/DVD is the largest single slot in the enclosure. The EMC CD/DVD slot shield embodied by the present invention allows a CD/DVD to pass through the opening while electrically closing the slot with an RF seal at substantially all other times.

The size of a slot is measured by its linear dimension, not by its total volume. To electrically close a slot, it must either be completely closed by conductive material, or there needs to be multiple contact points along the length of the slot to break it into sufficiently short lengths so that the wavelength of energy cannot escape. To this end, the EMC CD/DVD slot shield accomplishes this through its construction in the following ways:

What is claimed is:

1. An apparatus to contain radio frequency energy within the housing of an electronic device, the apparatus comprising:
    a flexible covering substantially impermeable to radio frequency energy and having a slot therein, the flexible covering attached to the housing of the electronic device to cover an opening in the housing, wherein the flexible covering is an electrically conductive cloth, wherein the slot has an edge selected from the group consisting of at least a fuzzy edge and at least a serrated edge.

2. The apparatus of claim 1 wherein a first edge of the slot substantially touches a second edge of the slot such that a gap along a length of the slot has a longitudinal length equivalent to or less than 1/20 of the particular radio frequency wavelength to be contained.

3. The apparatus of claim 1 wherein the flexible covering is non-abrasive.

4. The apparatus of claim 1 wherein a colored dust covering is positioned adjacent to the flexible covering to achieve a desired aesthetic appearance.

5. The apparatus of claim 1 wherein the opening in the housing is a DVD slot.

6. The apparatus of claim 1 wherein the opening in the housing is a CD slot.

7. The apparatus of claim 1, further comprising:
    a frame attached to the flexible covering to support the flexible covering; and
    an electrically conductive adhesive applied to at least the flexible covering to adhere the flexible covering to at least the housing such that electrical contact is made between at least the flexible covering and the housing.

8. The apparatus of claim 7 wherein the frame comprises an electrically conductive material.

9. An apparatus to contain radio-frequency energy within a housing of an electronic device, the apparatus comprising:
    a flexible covering substantially impermeable to radio frequency energy and having a slot therein, the flexible covering attached to the housing of the electronic device to cover an opening in the housing;
    a frame attached to the flexible covering to support the flexible covering; and
    an electrically conductive adhesive applied to at least the flexible covering to adhere the flexible covering to at least the housing such that electrical contact is made between at least the flexible covering and the housing.

10. The apparatus of claim 9 wherein the opening in the housing is a DVD slot.

11. The apparatus of claim 9 wherein the opening in the housing is a CD slot.

12. The apparatus of claim 9 wherein the frame comprises an electrically conductive material.

13. The apparatus of claim 9 wherein the flexible covering is an electrically conductive cloth.

14. The apparatus of claim 9 wherein the slot has an edge selected from the group consisting of at least a blunt edge, at least a fuzzy edge, and at least a serrated edge.

15. The apparatus of claim 9 wherein a first edge of the slot substantially touches a second edge of the slot such that a gap along a length of the slot has a longitudinal length equivalent to or less than 1/20 of the particular radio frequency wavelength to be contained.

16. The apparatus of claim 9 wherein the flexible covering is non-abrasive.

17. The apparatus of claim 9 wherein a colored dust covering is positioned adjacent to the flexible covering to achieve a desired aesthetic appearance.

* * * * *